United States Patent
Väänänen et al.

(10) Patent No.: US 7,142,062 B2
(45) Date of Patent: Nov. 28, 2006

(54) VCO CENTER FREQUENCY TUNING AND LIMITING GAIN VARIATION

(75) Inventors: Paavo Väänänen, Nokia (FI); Petri Heliö, Tampere (FI)

(73) Assignee: Nokia Corporation, Espoo (FI)

( * ) Notice: Subject to any disclaimer, the term of this patent is extended or adjusted under 35 U.S.C. 154(b) by 45 days.

(21) Appl. No.: 11/027,563

(22) Filed: Dec. 30, 2004

(65) Prior Publication Data
US 2006/0145769 A1     Jul. 6, 2006

(51) Int. Cl.
    *H03L 7/00*     (2006.01)
(52) U.S. Cl. .............................. 331/11; 331/25; 455/260
(58) Field of Classification Search ................. 331/1 A, 331/10, 11, 14, 16–18, 25, 44, 179; 327/156–159; 329/325; 332/127; 360/51; 375/376; 455/260
    See application file for complete search history.

(56) References Cited

U.S. PATENT DOCUMENTS

| 5,625,325 | A  | 4/1997  | Rotzoll et al. |
| 6,233,441 | B1 | 5/2001  | Welland |
| 6,308,055 | B1 | 10/2001 | Welland et al. |
| 6,327,463 | B1 | 12/2001 | Welland |
| 6,388,536 | B1 | 5/2002  | Welland |
| 6,825,785 | B1 | 11/2004 | Huang et al. |
| 2001/0020875 | A1 | 9/2001 | Jansson |
| 2002/0009984 | A1 | 1/2002 | Welland et al. |
| 2002/0034932 | A1 | 3/2002 | Welland |
| 2003/0042985 | A1* | 3/2003 | Shibahara et al. ............ 331/17 |
| 2003/0206065 | A1 | 11/2003 | Gomez et al. |

FOREIGN PATENT DOCUMENTS

| EP | 1189351 A2 | 3/2002 |
| JP | 2000188527 | 7/2000 |

* cited by examiner

*Primary Examiner*—David Mis

(57) ABSTRACT

This invention describes a method for simultaneous precise center frequency tuning and limiting a gain variation of a voltage controlled oscillator (VCO) of a phase locked loop (PLL) of an electronic device (e.g., a communication device, a mobile electronic device, a mobile phone, etc.). The invention utilizes frequency measurements and arithmetical optimizations. More specifically, the invention implementation is based on an analysis which includes measuring a frequency of a VCO and calculating a gain of the voltage controlled oscillator (VCO) using a predetermined criterion. The key element for implementing said analysis is a control and arithmetic block. The present invention can be used in any radio architecture that requires limiting of the VCO gain variation and tuning its center frequency.

29 Claims, 3 Drawing Sheets

VCO CENTER FREQUENCY TUNING AND LIMITING GAIN VARIATION

CROSS-REFERENCE TO RELATED APPLICATION

This application discloses subject matter which is also disclosed and which may be claimed in co-pending, co-owned applications 11/026,560 filed on even date herewith.

TECHNICAL FIELD

This invention generally relates to calibration of electronic devices and more specifically to precise tuning of a voltage-controlled oscillator center frequency and limiting its gain variation.

BACKGROUND ART

A phase locked loop (PLL) is traditionally used to generate a local oscillator (LO) signal in cellular and non-cellular radio transceivers. One of the key parts of the loop is a voltage controlled oscillator (VCO) generating an output signal which is the LO signal. Current silicon based integrated circuit manufacturing processes enable integrating of all the PLL blocks including the VCO to one chip if the process tolerances are taken into account during a design process. This requires calibrating the tolerances in the production line of the end product or at a suitable time when the device is turned on.

A traditional way to implement a transmitter on a radio application specific integrated circuit (ASIC) is to use a quadrature modulator to produce a radio frequency single sideband signal. A similar radio frequency signal can be also generated by using a so-called direct polar conversion. In these applications, a VCO control voltage is modulated to provide a signal phase modulation. An envelope modulation can be produced, for example, by modulating a power supply of a power amplifier. The polar conversion decreases an area of a transmitter on the ASIC and reduces a power dissipation with a proper design. On the other hand, it sets stringent requirements on individual transmitter block specifications, e.g., a PLL open loop gain variation. A VCO gain is an important parameter describing the open loop gain.

In a receiver, the PLL open loop gain may not be so precisely defined but the VCO just needs to be able to produce the right frequency in a certain tuning voltage range considered safe for the particular design. However, if the settling time of the PLL is needed to be optimized, the VCO gain optimization may be used in the receiver as well.

There are two aspects determining the design problem of integrated VCOs of which the first one is common to all receiver and transmitter architectures utilizing the integrated VCO and the second one is more related to the polar transmitter architecture.

First, the VCO center frequency varies due to the process and temperature variations so much that some coarse tuning of a resonator tank is needed to compensate the variations. The most popular way of doing so is to use a digitally controllable capacitor array in parallel with the resonator coil. Also resonator tuning, in series with the resonator coil or any other control type affecting the VCO center frequency, can be used.

Second, an accurate control of the PLL open loop gain requires controlling several parameters of the loop. One way of implementing the control is to make some measurements using analogue to digital conversions and then calculate calibration coefficients in a digital domain and convert them back to an analog parameter (e.g., a charge pump current) for the open loop gain tuning. The tuning is necessary to meet polar conversion requirements for all possible conditions over the frequency range, e.g., when at least a traditional PLL architecture containing a charge-pump, a passive loop filter and a varactor controlled VCO is utilized. It is well known that when less bits are needed for tuning, it reduces the converter design non-linearity problems arising from a device mismatch. The VCO gain variation range over the frequency band in use will affect requirements set to a DA (digital-to-analog) conversion compensating a VCO gain error effect on the VCO open loop gain.

There are several existing methods for coarse tuning a center frequency of the integrated VCO. However, none of the known prior art methods deal with a VCO gain variation at the same time.

DISCLOSURE OF THE INVENTION

The object of the present invention is to provide a methodology for simultaneous precise center frequency tuning and limiting a gain variation of a voltage controlled oscillator of a phase locked loop (PLL) of an electronic device (e.g., a mobile phone).

According to a first aspect of the invention, a method for simultaneous center frequency tuning and limiting a gain variation of a voltage controlled oscillator (VCO) of a phase locked loop (PLL), comprises the steps of: providing a VCO output signal of the voltage controlled oscillator to a calibration control module of the phase locked loop (PLL); providing a reference frequency signal containing a stable reference frequency to the calibration control module; and generating in response to the VCO output signal and to the reference frequency signal by the calibration control module and providing to the voltage controlled oscillator a VCO tuning voltage signal and a calibration signal for simultaneously implementing the center frequency tuning of the VCO output signal and the limiting of the gain variation of the voltage controlled oscillator (VCO) according to a predetermined criterion.

According further to the first aspect of the invention, the VCO tuning voltage signal and the calibration signal may be generated by analyzing according to the predetermined criterion the VCO output signal and optionally by analyzing according to the predetermined criterion a selected number of previous VCO output signals provided to the calibration control module at pre-selected past time periods, wherein the pre-selected number is an integer of at least a value of one. Still further, the analysis according to the predetermined criterion may include measuring a frequency of the VCO output signal and the selected number of the previous VCO output signals and calculating a gain of said voltage controlled oscillator (VCO) based on the measuring of the frequency of the VCO output signal and of the previous VCO output signals and using the predetermined criterion, and the analysis is optionally performed by a control and arithmetic block of the calibration control module.

Further according to the first aspect of the invention, the VCO tuning voltage signal may be provided to a voltage controlled oscillator core of the voltage controlled oscillator and optionally the VCO tuning voltage signal is an analog signal.

Still further according to the first aspect of the invention, the calibration signal may be provided to a VCO calibration block of the voltage controlled oscillator, wherein optionally the calibration signal may be in a digital format and the VCO calibration block may be a digitally controlled capacitor.

According further to the first aspect of the invention, the step of the generating the VCO tuning voltage signal and the calibration signal comprises: providing a counter signal by a counter to a control and arithmetic block of the calibration control module in response to the VCO output signal and to the reference frequency signal, wherein the VCO output signal is optionally divided by a pre-selected number in a frequency domain using a divider; and generating the calibration signal and a DAC word signal by the control and arithmetic block in response to the counter signal, wherein the DAC word signal optionally is the VCO tuning voltage signal. Still further, the calibration signal and the DAC word signal may both be in a digital format and the step of the generating the VCO tuning voltage signal and the calibration signal may further comprise: converting the digital DAC word signal into the VCO tuning voltage signal by a DAC block, wherein the VCO tuning voltage signal is an analog signal. Further still, the counter, the divider and the DAC block may be contained in the calibration control module.

According still further to the first aspect of the invention, the voltage controlled oscillator (VCO) may be a part of an electronic communication device and used for transmitting or for receiving information in the electronic communication device. Further still, a user of the electronic communication device may program the control and arithmetic block through a user interface for entering the predetermined criterion. Still further, the electronic communication device may be a transmitter or a receiver, or both the transmitter and the receiver, or a portable communication device, or a mobile electronic device or a mobile phone.

According to a second aspect of the invention, a computer program product comprising: a computer readable storage structure embodying computer program code thereon for execution by a computer processor with the computer program code characterized in that it includes instructions for performing the steps of the first aspect of the invention.

According to a third aspect of the invention, an electronic device capable of simultaneous center frequency tuning and limiting a gain variation of a voltage controlled oscillator (VCO) of a phase locked loop (PLL), comprises: a voltage controlled oscillator, for providing a VCO output signal; a reference frequency block, for providing a reference frequency signal containing a stable reference frequency; and a calibration control module, responsive to the VCO output signal and to the reference frequency signal, for providing a VCO tuning voltage signal and a calibration signal to the voltage controlled oscillator for simultaneously implementing the center frequency tuning and the limiting of the gain variation of the VCO output signal of the voltage controlled oscillator (VCO) according to a predetermined criterion.

According further to the third aspect of the invention, the VCO tuning voltage signal and the calibration signal may be generated by analyzing according to the predetermined criterion the VCO output signal and optionally by analyzing according to the predetermined criterion a selected number of previous VCO tuning voltage signals provided to the calibration control module at pre-selected past time periods, wherein the pre-selected number is an integer of at least a value of one. Still further, the analysis according to the predetermined criterion may include measuring a frequency of the VCO output signal and the selected number of the previous VCO output signals and calculating a gain of the voltage controlled oscillator (VCO) based on the measuring of the frequency of the VCO output signal and of the previous VCO output signals and using the predetermined criterion, and the analysis is optionally performed by a control and arithmetic block of the calibration control module.

Further according to the third aspect of the invention, the voltage controlled oscillator may comprise: a voltage controlled oscillator core, responsive to the VCO tuning voltage signal, wherein optionally the VCO tuning voltage signal is an analog signal.

Still further according to the third aspect of the invention, the voltage controlled oscillator may comprise: a VCO calibration block, responsive to the calibration signal, wherein optionally the calibration signal is in a digital format and the VCO calibration block is a digitally controlled capacitor.

According further to the third aspect of the invention, the voltage controlled oscillator (VCO) may be used for transmitting or for receiving information.

According still further to the third aspect of the invention, the calibration control module may comprise: a counter, responsive to the VCO output signal or optionally to the VCO output signal divided by a pre-selected number in a frequency domain, for providing a counter signal; a control and arithmetic block, responsive to the counter signal, for providing the calibration signal and a DAC word signal, wherein the DAC word signal optionally is the VCO tuning voltage signal. Further, the electronic device may comprise a divider, responsive to the VCO output signal, for performing the division of the VCO output signal by the pre-selected number in the frequency domain. Yet still further, the calibration signal and the control PLL signal may both be in a digital format and the calibration control module may further comprise: a DAC block, responsive to the control PLL signal, for providing the VCO tuning voltage signal, wherein the VCO tuning voltage signal is an analog signal.

According yet still further to the third aspect of the invention, a user of the electronic device may program the control and arithmetic block through a user interface for entering the predetermined criterion.

According further still to the third aspect of the invention, the electronic device may be a transmitter or a receiver, or both the transmitter and the receiver, or an electronic communication device, or a portable communication device, or a mobile electronic device or a mobile phone.

According to a fourth aspect of the invention, an integrated circuit capable of simultaneous center frequency tuning and limiting a gain variation of a voltage controlled oscillator (VCO) of a phase locked loop (PLL), comprises: a voltage controlled oscillator, for providing a VCO output signal; and a calibration control module, responsive to the VCO output signal and to a reference frequency signal containing a stable reference frequency, for providing a VCO tuning voltage signal and a calibration signal to the voltage controlled oscillator for simultaneously implementing the center frequency tuning and said limiting of the gain variation of the VCO output signal of the voltage controlled oscillator (VCO) according to a predetermined criterion.

According further to the fourth aspect of the invention, the VCO tuning voltage signal and the calibration signal may be generated by analyzing according to the predetermined criterion the VCO output signal and optionally by analyzing according to the predetermined criterion a selected number of previous VCO tuning voltage signals provided to the calibration control module at pre-selected past time periods, wherein the pre-selected number is an integer of at least a value of one. Further still, the analysis according to the predetermined criterion may include measuring a frequency of the VCO output signal and of the selected number of the previous VCO output signals and calculating a gain of the voltage controlled oscillator (VCO) based on the measuring of the frequency of the VCO output signal and of the previous VCO output signals and using the predetermined criterion, and the analysis is optionally performed by a control and arithmetic block of the calibration control module.

According still further to the fourth aspect of the invention, the integrated circuit may further comprises: a reference frequency block, for providing the reference frequency signal containing the stable reference frequency.

Existing (prior art) VCO tuning algorithms do not provide an adequate control of a VCO gain, which is provided by the present invention. Furthermore, a clear advantage is that the algorithm described by the present invention can be implemented as an almost totally autonomous and relatively fast on-chip system, i.e., the role of external controls can be minimized. The tuning in said "relatively fast" on-chip system can be performed, e.g., in between consecutive GSM (global system for mobile communications) transmitter slots of the mobile device.

BRIEF DESCRIPTION OF THE DRAWINGS

For a better understanding of the nature and objects of the present invention, reference is made to the following detailed description taken in conjunction with the following drawings, in which.

BEST MODE FOR CARRYING OUT THE INVENTION

The present invention provides a new methodology for simultaneous precise center frequency tuning and limiting a gain variation of a voltage controlled oscillator (VCO) of a phase locked loop (PLL) of an electronic device (e.g., electronic communication device, a portable communication device, a mobile electronic device, a mobile phone, etc.).

The invention utilizes frequency measurements and arithmetical optimizations. More specifically, the invention implementation is based on an analysis which includes measuring a frequency of a VCO tuning voltage (a VCO output signal) and calculating a gain of the voltage controlled oscillator (VCO), wherein the analysis is based on a predetermined criterion. The key element for implementing said analysis is a control and arithmetic block as described below in detail.

The present invention can be used in any radio architecture that requires limiting of the VCO gain variation and tuning its center frequency. The invention can be implemented with an on-chip logic (using, e.g., an application specific integrated circuit) or it can use an off-chip control and arithmetic unit.

Figure 1:
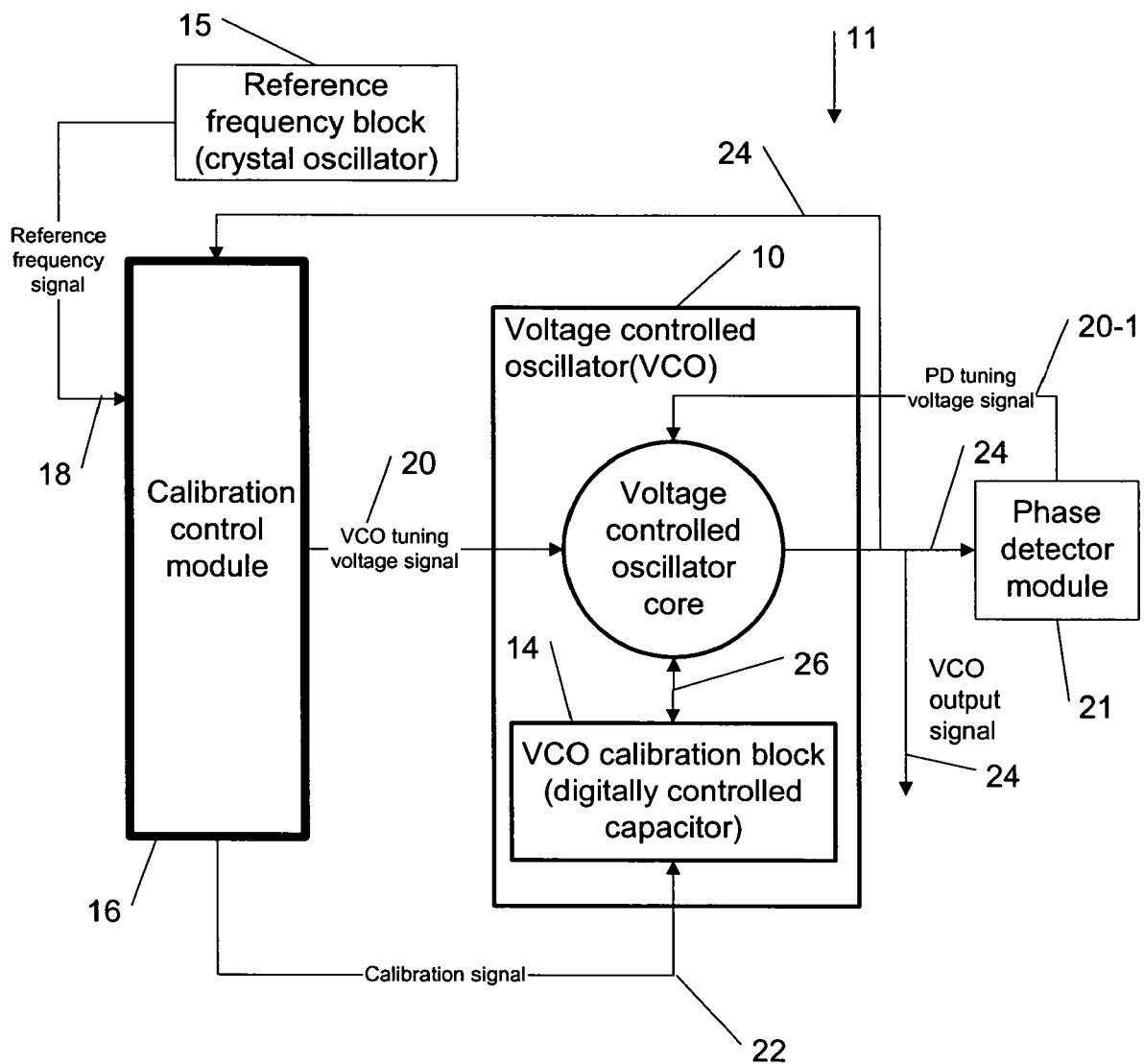
FIG. 1 is a block diagram demonstrating simultaneous center frequency tuning and limiting a gain variation of a voltage controlled oscillator of a phase locked loop (PLL), according to the present invention.

FIG. 1 shows an example among others of a block diagram demonstrating simultaneous center frequency tuning and limiting a gain variation of a voltage controlled oscillator (VCO) 10 of a phase locked loop (PLL) 11, according to the present invention. FIG. 1 shows a calibration control module 16 providing a VCO calibration for the simultaneous center frequency tuning and limiting the gain variation of the VCO 10, according to the present invention. Other standard PLL components, e.g. a phase detector, a low-pass filter, etc., are shown in FIG. 1 as a combined phase detector module 21, wherein said module 21 is not involved in the VCO calibration described in the present invention but routinely used for a normal PLL operation after completing said VCO calibration. Module 21 provides a normal PD tuning voltage signal 20-1 to the VCO 10 at its normal PLL operation mode. Switching from the VCO calibration mode to the normal PLL operation mode is described below in regard to FIG. 3.

A voltage controlled oscillator 10 generates and provides a VCO output signal 24 to a calibration control module 16 of said phase locked loop (PLL) 11. A reference frequency signal 18 (having a stable frequency) is also provided to said calibration control module 16 by a reference frequency block 15 (e.g., as a buffered crystal oscillator).

In response to the VCO output signal 24 and to the reference frequency signal 18, said calibration control module 16 generates and provides to said voltage controlled oscillator 10 a VCO tuning voltage signal 20 (for changing a VCO frequency) and a calibration signal 22 for simultaneously implementing the center frequency tuning and said limiting of the gain variation of the voltage controlled oscillator (VCO) 10 according to a predetermined criterion. Typically, the VCO tuning voltage signal 20 is an analog signal and the calibration signal 22 is a digital signal. The voltage controlled oscillator 10 comprises a voltage controlled oscillator core 12 responsive to said VCO tuning voltage signal 20 and a VCO calibration block 14 (e.g., a digitally controlled capacitor) responsive to the calibration signal 22.

Figure 2:
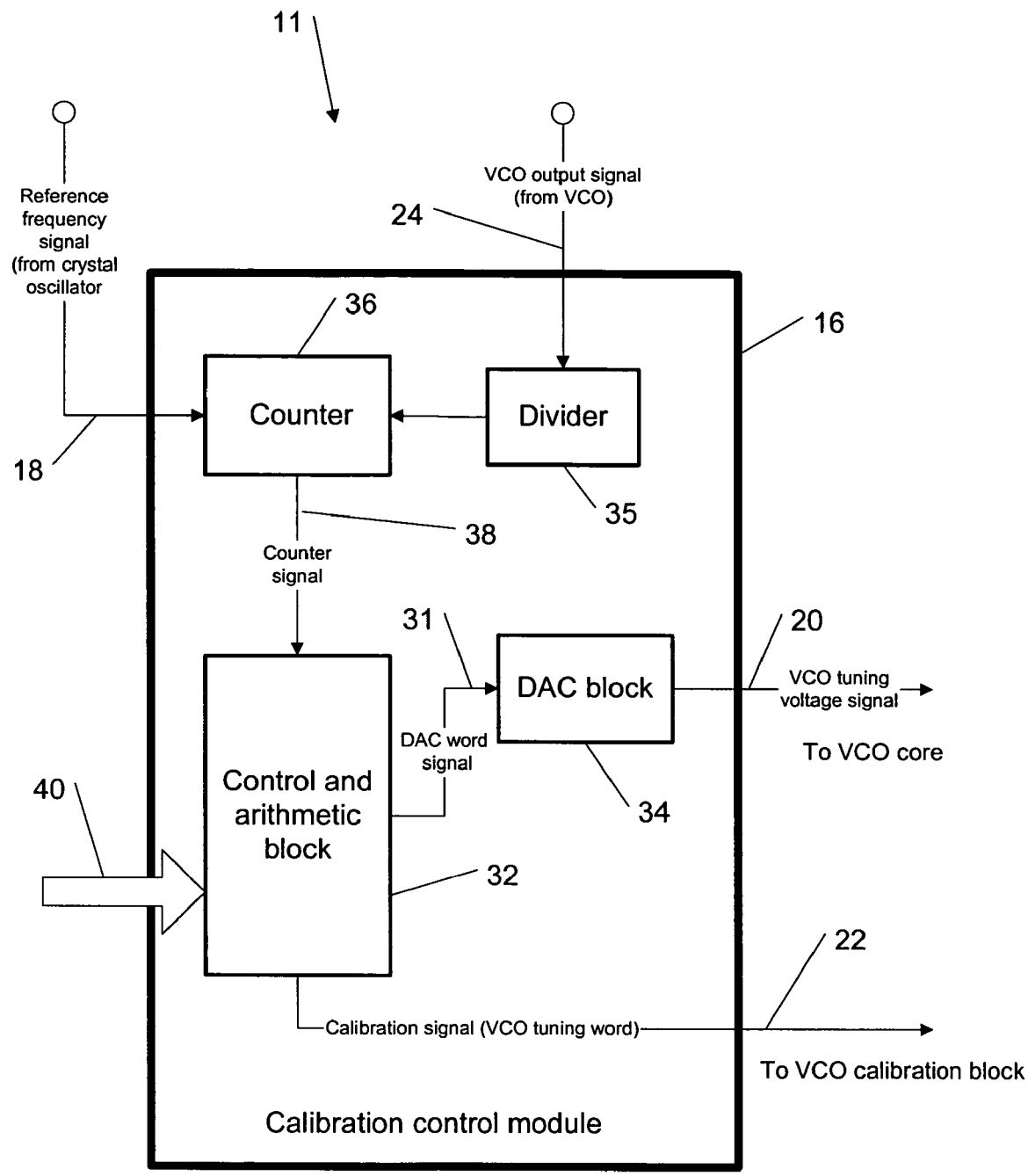
FIG. 2 is a block diagram demonstrating one possible implementation of a calibration control module of FIG. 1, according to the present invention.

Moreover, according to the present invention, said analysis according to said predetermined criterion includes measuring a frequency of the VCO output signals 24 and of said selected number of previous VCO output signals 24 and calculating a gain of said voltage controlled oscillator (VCO) 10 based on said measuring of said frequency of the current and previous VCO tuning voltage signals 20 and using said predetermined criterion and, in a preferred embodiment of the present invention, the analysis is performed by a control and arithmetic block 32 of the calibration control module 16 as described below regarding FIG. 2. An example of the calibration (tuning) procedure using the analysis described above using the predetermined criterion is described in detail below regarding FIG. 3.

It is noted, that the voltage controlled oscillator (VCO) 10 can be a part of an electronic communication device and can be used for transmitting or for receiving information in said electronic communication device. In other words said electronic communication device can be a transmitter, a receiver or both the transmitter and the receiver.

FIG. 2 shows a block diagram demonstrating one possible implementation among others of a calibration control module 16 of FIG. 1, according to the present invention. FIG. 2 provides more details on how the VCO tuning voltage signal 20 and the calibration signal 22 are generated. A counter signal 38 is generated by a counter 36 and provided to the control and arithmetic block 32 of said calibration control module 16 in response to said VCO output signal 24 and to said reference frequency signal 18. Typically, as a part of a normal PLL operation, the VCO output signal 24 is divided by a pre-selected number in a frequency domain using a divider 35.

In response to the counter signal 38, the control and arithmetic block 32 generates a DAC word signal (containing a DAC word) 31 for fine tuning of the center frequency of the voltage controlled oscillator 10. In a preferred embodiment of the present invention, the digital DAC word signal 31 is converted into said VCO tuning voltage signal 20 by a DAC block 34, wherein, typically, said VCO tuning voltage signal 20 is an analog signal as was pointed out above. Alternatively, according to the present invention, if said DAC word signal 31 is generated directly in an analog format by the control and arithmetic block 32, then said DAC word signal 31 is the VCO tuning voltage signal 20. Furthermore, in response to said counter signal 38, the control and arithmetic block 32 simultaneously generates said calibration signal (containing a VCO tuning word), primarily for controlling the gain variation of a voltage controlled oscillator 10 simultaneously providing the center frequency tuning.

According to the present invention, the control and arithmetic block 32 takes care of measurement sequencing and arithmetic operations and performs the analysis described above according to the predetermined criterion. A user of the electronic communication device containing said PPL 11 can program the control and arithmetic block 32 through a user interface 40 for entering and implementing said predetermined criterion.

Figure 3:
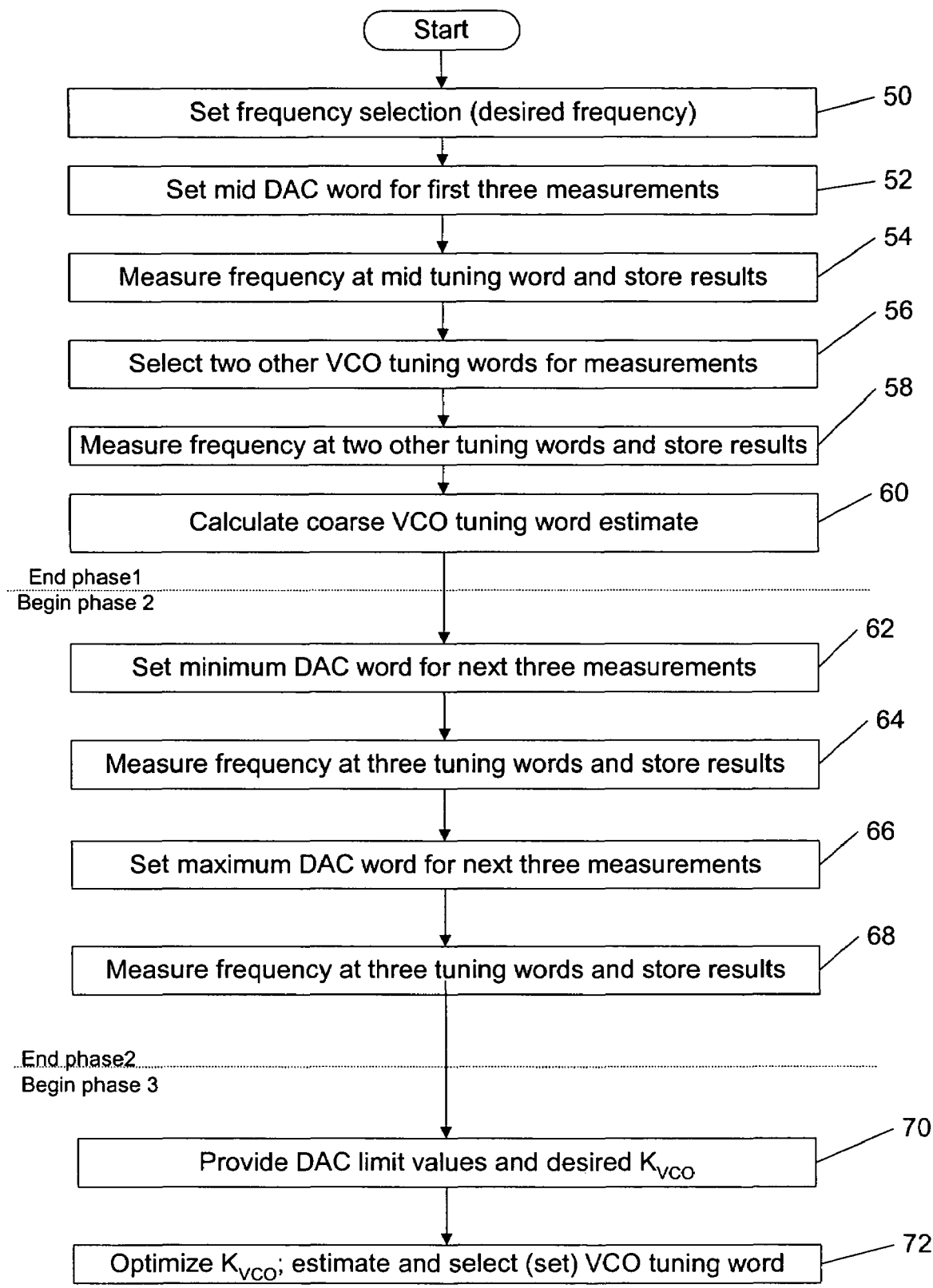
FIG. 3 is a flow diagram demonstrating a calibration procedure for the phase locked loop of FIGS. 1 and 2, according to the present invention.

FIG. 3 shows a flow diagram demonstrating a calibration procedure for the phase locked loop 11 of FIGS. 1 and 2 for transmitter tuning, according to the present invention.

The flow chart of FIG. 3 only represents one possible scenario among many others. In a method according to the present invention, in a first step 50, the frequency selection (e.g., a desired frequency or a desired frequency range) is made. In a next step 52, a first DAC word, e.g., a mid DAC word contained in the DAC word signal 31 is set for first three measurements with three different VCO tuning words contained in the calibration signal 22. A DAC word, chosen according to the predetermined criterion mentioned above, refers to a digital input word of the DAC block 34 that generates a certain analog output voltage. Typically, the mid DAC word, as well as other DAC words for measurements described below, are selected from a set that is defined by a number of DAC control bits (e.g., a number of bits) and their choice is also dependent on a particular design (e.g., selected coding). Usually there is a safe operating area for a VCO tuning voltage contained in the VCO tuning voltage signal 20 that may be defined, e.g., by a charge pump output dynamic range (a charge pump is a part of the phase detector module 21 shown in FIG. 1). A safe choice for the mid DAC word would be one that produces a voltage in the middle of a safe operating range (e.g., between $V_{low}$ and $V_{max}$). In a preferred embodiment of the present invention, these parameters (DAC words, $V_{low}$ and $V_{max}$) are user programmable parameters (e.g., through the user interface 40).

In a next step 54, the frequency of the VCO output signal 24 is measured for the mid DAC word at a mid VCO tuning (calibration) word (contained in the calibration signal 22) and results are stored. Once again the mid VCO tuning word, as well as other VCO tuning words described below, are dependent parameters of the particular design and application. They are chosen (e.g., again through the user interface 40) to facilitate a good model for the VCO's frequency vs. the VCO tuning word characteristics. For example, if a frequency of interest is 1815 MHz and it is known beforehand that a 6-bit VCO will produce that frequency of 1815 MHz in a range of the VCO tuning words from 34 to 44, then it can be best to configure the VCO tuning words to be 34, 38 and 42 with the mid VCO tuning word of 38.

In a next step 56, two other VCO tuning words (e.g., low and high) for similar VCO frequency measurements are selected. In a next step 58, the frequency of the VCO output signal 24 is measured for the mid DAC at low and high VCO tuning words (contained in the calibration signal 22) and results are stored. In a next step 60, a coarse estimate of the VCO tuning word contained in the calibration signal 22 is made by the control and arithmetic block 32 using said predetermined criterion, e.g., by building a set of equations (e.g., a polynomial approximation) utilizing said stored three frequency measurement results with mid DAC word for three VCO tuning words and by using the equations finding a VCO calibration word that produces the frequency closest to the desired frequency (at the mid DAC word). Step 60 concludes a first phase of the calibration procedure. The purpose of this first phase is to make frequency measurements for a coarse estimate of the VCO tuning word contained in the calibration signal 22. The next two phases (steps 62–68 and 70–72, respectively) are for characterizing $K_{VCO}$, the gain of the voltage controlled oscillator (VCO) 10.

In a next step 62, a min DAC word contained in the DAC word signal 31 is set for the next three measurements with three different VCO tuning words contained in the calibration signal 22 (e.g., the same three VCO tuning words as in the first phase described above). In a next step 64, the frequency of the VCO output signal 24 is measured for the min DAC word at three (low, mid, high) VCO tuning words and results are stored. In a next step 66, a max DAC word contained in the DAC word signal 31 is set for next three measurements with three different VCO tuning words (e.g., the same three VCO tuning words as in the first phase described above). In a next step 68, the frequency of the VCO output signal 24 is measured for the max DAC word at three (low, mid, high) VCO tuning words and results are stored.

In a next step 70 (beginning of the third phase), DAC limit values (e.g., referred to as $V_{min}$ and $V_{max}$, defining the safe operating area limits of the VCO input voltage) and a desired $K_{VCO}$ (a desired gain of the voltage controlled oscillator (VCO) 10) are provided to the module 32. ($K_{VCO}$ in the presented algorithm is in units of MHz/V and defined as a slope of a frequency vs. VCO voltage curve.)

In a next step 72, the $K_{VCO}$ is optimized and a VCO tuning word is estimated and selected (set). An optimization process of $K_{VCO}$ can comprise: building similar equations for the other two sets of measurements (with min and max DAC words) as for the coarse VCO tuning and using those to estimate the DAC word that produces the desired frequency with a VCO tuning (calibration) word found by the coarse estimate in the first phase as described above and then calculating $K_{VCO}$ and $K_{VCO\_error}$. Next, the VCO tuning word is increased or decreased depending on the error sign and DAC word producing the wanted frequency, $K_{VCO}$ and $K_{VCO\_error}$ are estimated again. The process continues until the $K_{VCO\_error}$ starts to increase. During step 72 there is also a check that the safe operating area (e.g., the range for the DAC word given in 70) has not been exceeded and that the next VCO tuning word is not exceeding the desired range for the VCO tuning word. After $K_{VCO}$ is optimized as described above, the VCO tuning word (provided by the calibration signal 22) is set.

At this point, the VCO calibration procedure is completed and the VCO 10 can be switched to the normal PLL operation: the PD tuning voltage signal 20-1 is enabled and VCO tuning voltage signal 20 is disabled (apparently, when the VCO calibration is needed again the PD tuning voltage signal 20-1 is disabled and VCO tuning voltage signal 20 is enabled for switching to the VCO calibration mode). The calibration signal 22 containing the found value of the VCO tuning word can be still provided to the VCO 10 or alternatively there exists a memory cell in the VCO 10 to store the found value of the VCO tuning word.

According to the present invention, said estimated DAC word can be set as the DAC word signal 31 to drive an initial value of the VCO tuning voltage signal 20 to a VCO tuning voltage input, e.g., to a loop filter (typically, the loop filter is a low-pass filter component which can be contained in the block 21 and incorporated between the phase detector and the VCO 10 or the charge pump and VCO 10 depending on the PLL architecture) that could decrease a PLL settling time when the PLL is enabled for the normal PLL operation and the tuning voltage 20-1 is defined by the closed loop operation.

It is noted that some steps shown in FIG. 3 can be performed in parallel. For example, steps 60 and 62 can be performed simultaneously. Also, a similar but simplified (e.g., requiring only coarse tuning of phase one) calibration procedure shown in FIG. 3 can be used for receiver tuning if the settling time optimization has no major importance. The same applies to transmitter architectures that use no direct VCO modulation.

It is to be understood that the above-described arrangements are only illustrative of the application of the principles of the present invention. Numerous modifications and alternative arrangements may be devised by those skilled in the art without departing from the scope of the present invention, and the appended claims are intended to cover such modifications and arrangements.

What is claimed is:

1. A method comprising:
    providing at least one VCO tuning voltage signal to a voltage controlled oscillator of a phase locked loop by a calibration control module using a predetermined criterion;
    providing, using said at least one VCO tuning voltage signal, at least one VCO output signal by said voltage controlled oscillator to the calibration control module;
    providing a reference frequency signal containing a stable reference frequency to said calibration control module;
    providing a predetermined number of frequency measurements of the at least one VCO output signal by a counter using said at least one VCO output and said reference frequency signal; and
    providing to said voltage controlled oscillator by said calibration control module, in response to said predetermined number of frequency measurements, a calibration signal for simultaneously implementing center frequency tuning of a VCO output signal and limiting a gain variation of said voltage controlled oscillator according to said predetermined criterion.

2. The method of claim 1, wherein said VCO tuning voltage signal and said calibration signal are provided by analyzing according to said predetermined criterion said VCO output signal and a selected number of previous VCO output signals provided to the calibration control module at pre-selected past time periods, wherein said pre-selected number is an integer of at least a value of one.

3. The method of claim 2, wherein said analysis according to said predetermined criterion includes measuring a frequency of said VCO output signal and of said selected number of said previous VCO output signals and calculating a gain of said voltage controlled oscillator based on said measuring of said frequency of said VCO output signal and of said previous VCO output signals and using said predetermined criterion.

4. The method of claim 1, wherein said VCO tuning voltage signal is provided to a voltage controlled oscillator core of said voltage controlled oscillator and said VCO tuning voltage signal is an analog signal.

5. The method of claim 1, wherein said calibration signal is provided to a VCO calibration block of said voltage controlled oscillator, wherein said calibration signal is in a digital format and said VCO calibration block is a digitally controlled capacitor.

6. The method of claim 1, wherein said calibration signal is generated by:
    providing a counter signal comprising said predetermined number of frequency measurements by said counter to a control and arithmetic block of said calibration control module in response to said VCO output signal and to said reference frequency signal, wherein said VCO output signal is divided by a pre-selected number in a frequency domain using a divider, wherein said pre-selected number has a value of one or more; and
    generating said calibration signal by said control and arithmetic block in response to said counter signal by carrying out arithmetic operations.

7. The method of claim 6, wherein said providing the at least one VCO tuning voltage signal comprises:
    generating a DAC word signal in a digital format; and
    converting said digital DAC word signal into said VCO tuning voltage signal by a DAC block, said VCO tuning voltage signal being an analog signal.

8. The method of claim 7, wherein said counter, said divider and said DAC block are contained in said calibration control module.

9. The method of claim 1, wherein said voltage controlled oscillator is a part of an electronic communication device and used for transmitting or for receiving information in said electronic communication device.

10. The method of claim 9, wherein said control and arithmetic block is configured to be programmed through a user interface for entering said predetermined criterion.

11. The method of claim 9, wherein said voltage controlled oscillator is a part of at least one of:
    a) a transmitter, and
    b) a receiver.

12. A computer program product comprising:
    a computer readable storage structure embodying computer program code thereon for execution by a computer processor with said computer program code, wherein said computer program code comprises instructions for performing the method of claim 1.

13. An electronic device, comprising:
    a voltage controlled oscillator of a phase locked loop, for providing at least one VCO output signal;
    a reference frequency block, for providing a reference frequency signal containing a stable reference frequency; and
    a calibration control module, responsive to said VCO output signal and to said reference frequency signal, for providing at least one VCO tuning voltage signal to said voltage controlled oscillator using a predetermined criterion, for providing a predetermined number of frequency measurements of the at least one VCO output signal by a counter using said at least one VCO output and said reference frequency signal, and for providing to said voltage controlled oscillator, in response to said predetermined number of frequency measurements, a calibration signal for simultaneously implementing center frequency tuning of a VCO output signal and limiting a gain variation of said voltage controlled oscillator according to the predetermined criterion.

14. The electronic device of claim 13, wherein said VCO tuning voltage signal and said calibration signal are provided by analyzing according to said predetermined criterion said VCO output signal and a selected number of previous VCO output signals provided to the calibration control module at pre-selected past time periods, wherein said pre-selected number is an integer of at least a value of one.

15. The electronic device of claim 14, wherein said analysis according to said predetermined criterion includes measuring a frequency of said VCO output signal and of said selected number of said previous VCO output signals and calculating a gain of said voltage controlled oscillator based on said measuring of said frequency of said VCO output signal and of said previous VCO output signals and using said predetermined criterion.

16. The electronic device of claim 13, wherein said voltage controlled oscillator comprises:
a voltage controlled oscillator core, responsive to said VCO tuning voltage signal, wherein said VCO tuning voltage signal is an analog signal.

17. The electronic device of claim 13, wherein said voltage controlled oscillator comprises:
a VCO calibration block, responsive to said calibration signal, wherein said calibration signal is in a digital format and said VCO calibration block is a digitally controlled capacitor.

18. The electronic device of claim 13, wherein said voltage controlled oscillator (VCO) is configured for transmitting or for receiving information.

19. The electronic device of claim 13, wherein said counter is configured to provide a counter signal comprising said predetermined number of frequency measurements, wherein said VCO output signal is divided by a pre-selected number in a frequency domain using a divider, wherein said pre-selected number has a value of one or more, and said calibration control module comprises:
a control and arithmetic block, responsive to said counter signal, for providing said calibration signal by carrying out arithmetic operations.

20. The electronic device of claim 19, further comprises:
a divider, responsive to the VCO output signal, for performing said division of said VCO output signal by said pre-selected number in the frequency domain.

21. The electronic device of claim 19, wherein said control and arithmetic block is configured to provide a DAC word signal in a digital format, and said calibration control module further comprises:
a DAC block, responsive to said DSC word signal, for providing said VCO tuning voltage signal, wherein said VCO tuning voltage signal is an analog signal.

22. The electronic device of claim 13, wherein said control and arithmetic block is configured to be programmed through a user interface for entering said predetermined criterion.

23. The electronic device of claim 13, wherein said voltage controlled oscillator is a part of at least one of:
a) a transmitter, and
b) a receiver.

24. An integrated circuit, comprising:
a voltage controlled oscillator of a phase locked loop, for providing at least one VCO output signal;
a reference frequency block, for providing a reference frequency signal containing a stable reference frequency; and
a calibration control module, responsive to said VCO output signal and to said reference frequency signal, for providing a at least one VCO tuning voltage signal to said voltage controlled oscillator using a predetermined criterion, for providing a predetermined number of frequency measurements of the at least one VCO output signal by a counter using said at least one VCO output and said reference frequency signal, and and providing to said voltage controlled oscillator, in response to said predetermined number of frequency measurements, a calibration signal for simultaneously implementing center frequency tuning of a VCO output signal and limiting a gain variation of said voltage controlled oscillator according to the predetermined criterion.

25. The integrated circuit of claim 24, wherein said VCO tuning voltage signal and said calibration signal are provided by analyzing according to said predetermined criterion said VCO output signal and a selected number of previous VCO output signals provided to the calibration control module at preselected past time periods, wherein said pre-selected number is an integer of at least a value of one.

26. The integrated circuit of claim 25, wherein said analysis according to said predetermined criterion includes measuring a frequency of said VCO output signal and of said selected number of said previous VCO output signals and calculating a gain of said voltage controlled oscillator based on said measuring of said frequency of said VCO output signal and of said previous VCO output signals and using said predetermined criterion.

27. The integrated circuit of claim 24, further comprising:
a reference frequency block, for providing said reference frequency signal containing said stable reference frequency.

28. An electronic device, comprising:
means for frequency control, for providing at least one VCO output signal;
means for reference, for providing a reference frequency signal containing a stable reference frequency; and
means for calibration, responsive to said VCO output signal and to said reference frequency signal, for providing at least one VCO tuning voltage signal to said means for frequency control using a predetermined criterion, for providing a predetermined number of frequency measurements of the at least one VCO output signal by a counter using said at least one VCO output and said reference frequency signal, and for providing to said means for frequency control, in response to said predetermined number of frequency measurements, a calibration signal for simultaneously implementing center frequency tuning of a VCO output signal and limiting a gain variation of said means for frequency control according to the predetermined criterion.

29. The electronic device of claim 28, wherein said means for frequency control is a voltage control oscillator.

* * * * *